United States Patent
Nam et al.

(10) Patent No.: US 10,017,692 B2
(45) Date of Patent: Jul. 10, 2018

(54) METHOD FOR MANUFACTURING QUANTUM DOTS

(71) Applicant: SAMSUNG DISPLAY CO., LTD., Yongin-si, Gyeonggi-do (KR)

(72) Inventors: Min Ki Nam, Anseong-si (KR); Baek Hee Lee, Yongin-si (KR); Young Min Kim, Asan-si (KR); Hae Il Park, Seoul (KR); Dong-Hoon Lee, Hwaseong-si (KR)

(73) Assignee: Samsung Display Co., Ltd., Yongin-si, Gyeonggi-do (KR)

(*) Notice: Subject to any disclaimer, the term of this patent is extended or adjusted under 35 U.S.C. 154(b) by 119 days.

(21) Appl. No.: 15/059,325

(22) Filed: Mar. 3, 2016

(65) Prior Publication Data

US 2017/0037314 A1    Feb. 9, 2017

(30) Foreign Application Priority Data

Aug. 7, 2015    (KR) .................. 10-2015-0111371

(51) Int. Cl.
*H01L 51/50*    (2006.01)
*C09K 11/88*    (2006.01)
*C09K 11/08*    (2006.01)
*C09K 11/54*    (2006.01)
*C09K 11/62*    (2006.01)
(Continued)

(52) U.S. Cl.
CPC ............ *C09K 11/883* (2013.01); *C09K 11/08* (2013.01); *C09K 11/0811* (2013.01); *C09K 11/54* (2013.01); *C09K 11/62* (2013.01); *H01L 51/502* (2013.01); *B82Y 40/00* (2013.01); *H01L 27/3281* (2013.01); *Y10S 977/774* (2013.01)

(58) Field of Classification Search
None
See application file for complete search history.

(56) References Cited

U.S. PATENT DOCUMENTS

| 6,322,901 B1 | 11/2001 | Bawendi et al. |
| 2011/0104043 A1* | 5/2011 | Niesz ............... A61K 9/146 423/509 |
| 2011/0227007 A1* | 9/2011 | Kang ............... C09K 11/623 252/519.51 |

FOREIGN PATENT DOCUMENTS

| KR | 10-0858765 B1 | 9/2008 |
| KR | 10-1324256 B1 | 11/2013 |
| KR | 10-2014-0108440 A | 9/2014 |

OTHER PUBLICATIONS

Chen, et al., "White-Light Emission from Organics-Capped ZnSe Quantum Dots and Application in White-Light-Emitting Diodes," Applied Physics Letter 86, 131905 (2005).

(Continued)

*Primary Examiner* — Katie L Hammer
(74) *Attorney, Agent, or Firm* — Lee & Morse, P.C.

(57) ABSTRACT

A method for manufacturing a quantum dot includes a method of manufacturing a quantum dot including heating a first mixture including a Group II precursor and a Group III precursor, adding an organic solvent to the first mixture and cooling the resultant under an inert gas atmosphere, adding a Group V precursor solution to the cooled resultant including the first mixture and the organic solvent to prepare a second mixture and heating the second mixture, and adding a mixture of a Group V precursor and a Group VI precursor to the second mixture to prepare a third mixture and allowing third mixture to react.

20 Claims, 4 Drawing Sheets

(51) Int. Cl.
    B82Y 40/00    (2011.01)
    H01L 27/32    (2006.01)

(56)    References Cited

OTHER PUBLICATIONS

Battaglia, et al., "Coupled and Decoupled Dual Quantum Systems in One Semiconductor Nanocrystal," Journal of American Chemical Society 127, pp. 10889-10897 (2005).
Chen, et al., "Direct Synthesis of Quantum Dots with Controllable Multimodal Size Distribution," Journal of Physical Chemistry 113, pp. 12236-12242 (2009).
Chen, et al., "White Light Emission from Semiconductor Nanocrystals by in situ Colour Tuning in an Alternating Thermodynamic-Kinetic Fashion," Journal of Materials Chemistry 21, pp. 5928-5932 (2011).

* cited by examiner

METHOD FOR MANUFACTURING QUANTUM DOTS

CROSS-REFERENCE TO RELATED APPLICATION

Korean Patent Application No. 10-2015-0111371, filed on Aug. 7, 2015, in the Korean Intellectual Property Office, and entitled: "Method for Manufacturing Quantum Dots," is incorporated by reference herein in its entirety.

BACKGROUND

1. Field

Embodiments relate to a method for manufacturing a quantum dot.

2. Description of the Related Art

A quantum dot is a semiconductor material having a nano-sized crystal structure. A quantum dot has a very small size and thus has a large surface area per unit volume. A quantum dot exhibits a quantum confinement effect and thus exhibits different physical/chemical characteristics from those of the semiconductor material itself.

The above information disclosed in this Background section is only to enhance the understanding of the background of the invention and therefore it may contain information that does not form the prior art that is already known in this country to a person of ordinary skill in the art.

SUMMARY

Embodiments are directed to a method of manufacturing a quantum dot including heating a first mixture including a Group II precursor and a Group III precursor, adding an organic solvent to the first mixture and cooling the resultant under an inert gas atmosphere, adding a Group V precursor solution to the cooled resultant including the first mixture and the organic solvent to prepare a second mixture and heating the second mixture, and adding a mixture of a Group V precursor and a Group VI precursor to the second mixture to prepare a third mixture and allowing third mixture to react.

Heating the first mixture may be performed in a reactor at about 100° C. to about 140° C. for about 30 to 90 minutes. Cooling the resultant obtained by adding the organic solvent to the first mixture may cool the resultant to room temperature.

Heating the second mixture may be performed by gradually increasing the temperature from room temperature to about 250 to about 350° C. at a rate of about 15 to 25° C./min.

The third mixture may be prepared by dripping the mixture of the Group V precursor solution and the Group VI precursor solution into the second mixture.

The third mixture may be allowed to react for about 5 to 15 minutes after the mixture of the Group V precursor solution and the Group VI precursor solution is dripped into the second mixture.

The first mixture may include the Group II precursor and the Group III precursor in a mole ratio of about 3:2.

The second mixture may include the Group V precursor and the Group II and Group III precursor in a mole ratio of about 1:1.

The third mixture may include the Group VI precursor and the Group II and Group III precursor in a mole ratio of about 1-2:1.

A Group II element of the Group II precursor may be at least one of zinc (Zn), cadmium (Cd), and mercury (Hg).

The Group II precursor may be at least one precursor compound selected from zinc acetate, dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, cadmium oxide, dimethyl cadmium, diethyl cadmium, cadmium carbonate, cadmium acetate dihydrate, cadmium acetylacetonate, cadmium fluoride, cadmium chloride, cadmium iodide, cadmium bromide, cadmium perchlorate, cadmium phosphide, cadmium nitrate, cadmium sulfate, cadmium carboxylate, mercury iodide, mercury bromide, mercury fluoride, mercury cyanide, mercury nitrate, mercury perchlorate, mercury sulfate, mercury oxide, mercury carbonate, and mercury carboxylate.

A Group III element of the Group III precursor may be at least one element of aluminum (Al), gallium (Ga), and indium (In).

The Group III precursor may be at least one precursor compound selected from aluminum phosphate, aluminum acetylacetonate, aluminum chloride, aluminum fluoride, aluminum oxide, aluminum nitrate, aluminum sulfate, gallium acetylacetonate, gallium chloride, gallium fluoride, gallium oxide, gallium nitrate, gallium sulfate, indium acetate, indium chloride, indium oxide, indium nitrate, indium sulfate, and indium carboxylate.

A Group V element of the Group V precursor may be at least one element of nitrogen (N), phosphorus (P), and arsenic (As).

The Group V precursor may be at least one precursor compound selected from alkyl phosphine, tris(trialkylsilyl) phosphine, tris(dialkylsilyl) phosphine, tris(dialkylamino) phosphine, arsenic oxide, arsenic chloride, arsenic sulfate, arsenic bromide, arsenic iodide, nitric oxide, nitric acid, and ammonium nitrate.

A Group VI element of the Group VI precursor may be at least one element of sulfur (S), selenium (Se), and tellurium (Te).

The Group VI precursor may be at least one precursor compound selected from sulfur, trialkylphosphine sulfide, trialkenylphosphine sulfide, alkylamino sulfide, alkenylamino sulfide, alkylthiol, selenium, trialkylphosphine selenide, trialkenylphosphine selenide, alkylamino selenide, alkenylamino selenide, trialkylphosphine telluride, trialkenylphosphine telluride, alkylamino telluride, and alkenylamino telluride.

The mixture of the Group V and Group VI precursor solutions may include at least one of hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, selenium-trioctylphosphine (Se-TOP), selenium-tributylphosphine (Se-TBP), selenium-triphenylphosphine (Se-TPP), tellurium-tributylphosphine (Te-TBP), tellurium-triphenylphosphine (Te-TPP), tris trimethylsilyl phosphine, trisdimethylamino phosphine, triethylphosphine, tributylphosphine, trioctylphosphine, triphenylphosphine, tricyclohexylphosphine, arsenic oxide, arsenic chloride, arsenic sulfate, arsenic bromide, arsenic iodide, nitric oxide, nitric acid, and ammonium nitrate.

The Group II precursor may include a zinc-containing precursor and a cadmium-containing precursor, the Group III precursor includes an indium-containing precursor. The Group V precursor may be a phosphine. The Group VI precursor may include a selenium-containing precursor and sulfur-containing precursor. The mixture of the Group V and Group VI precursor includes a sulfur phosphine compound and a selenium phosphine compound.

The Group II precursor may include cadmium oxide and zinc acetate. The Group III precursor may include indium acetate. The Group V precursor may include tris(trimethylsilyl)phosphine and trioctylphosphine. The Group VI precursor may include selenium and sulfur. The mixture of the Group V and Group VI precursor may include sulfur-trioctylphosphine and selenium-trioctylphosphine.

Embodiments are also directed to a method of forming a mixture of CdSe/ZnS quantum dots and InP/ZnS quantum dots, including heating a first mixture including cadmium oxide, zinc acetate, and indium acetate, and cooling the first mixture, adding tris(trimethylsilyl)phosphine and trioctylphosphine to the cooled resultant including the first mixture and the organic solvent to prepare a second mixture and heating the second mixture while increasing the temperature, and adding sulfur-trioctylphosphine and selenium-trioctylphosphine to the second mixture to prepare a third mixture and allowing third mixture to react.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
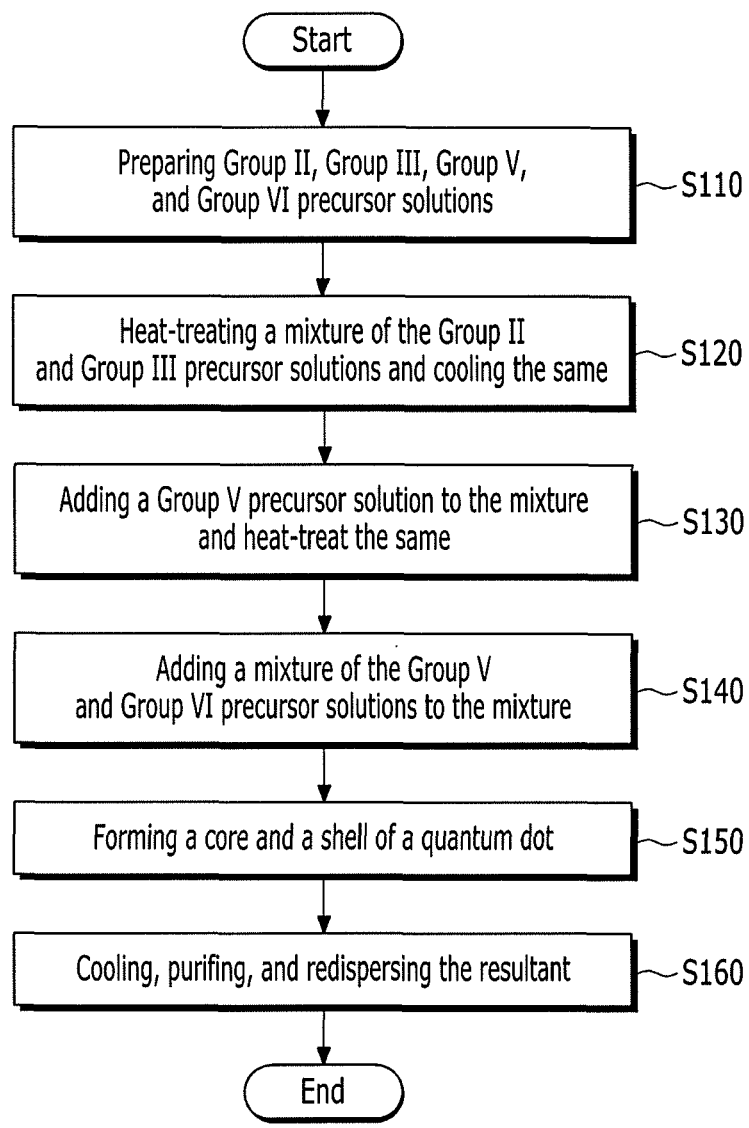
FIG. 1 illustrates a schematic flowchart showing a method for manufacturing a quantum dot according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Hereinafter, a method for manufacturing a quantum dot according to an embodiment is sequentially described in detail.

FIG. 1 illustrates a schematic flowchart showing stages of a method for manufacturing a quantum dot according to an embodiment.

Referring to FIG. 1, a method for manufacturing a quantum dot according to an embodiment may include preparing Group II, Group III, Group V, and Group VI precursor solutions (S110), heat-treating a mixture of the Group II and Group III precursor solutions and cooling the same (S120), adding a Group V precursor solution to the mixture and heat-treating the same (S130), adding a mixture of the Group V and Group VI precursor solutions to the mixture (S140), and reacting the mixture to form a core and a shell of a quantum dot (S150). The mixture in which the quantum dot is formed may be cooled to room temperature and then purified and re-dispersed (S160), obtaining a quantum dot having high purity.

Hereinafter, each stage of the process is described in detail.

Group II, Group III, Group V, and Group VI precursor solutions may be prepared (S110). A Group II precursor and a Group III precursor may each be mixed with a respective organic ligand compound, and the Group V precursor and Group VI precursor may each be dispersed in a respective organic solvent to prepare precursor solutions. The Group V precursor and the Group VI precursor may be dispersed in an appropriate solvent in advance, or, in some implementations, may be prepared right before addition to the mixture.

A Group II element of the Group II precursor may be at least one of zinc (Zn), cadmium (Cd), and mercury (Hg).

The Group II precursor may be at least one precursor compound selected from zinc acetate, dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, cadmium oxide, dimethyl cadmium, diethyl cadmium, cadmium carbonate, cadmium acetate dihydrate, cadmium acetylacetonate, cadmium fluoride, cadmium chloride, cadmium iodide, cadmium bromide, cadmium perchlorate, cadmium phosphide, cadmium nitrate, cadmium sulfate, cadmium carboxylate, mercury iodide, mercury bromide, mercury fluoride, mercury cyanide, mercury nitrate, mercury perchlorate, mercury sulfate, mercury oxide, mercury carbonate, and mercury carboxylate.

A Group III element of the Group III precursor may be at least one of aluminum (Al), gallium (Ga), and indium (In).

The Group III precursor may be at least one precursor compound selected from aluminum phosphate, aluminum acetylacetonate, aluminum chloride, aluminum fluoride, aluminum oxide, aluminum nitrate, aluminum sulfate, gallium acetylacetonate, gallium chloride, gallium fluoride, gallium oxide, gallium nitrate, gallium sulfate, indium acetate, indium chloride, indium oxide, indium nitrate, indium sulfate, and indium carboxylate.

A Group V element of the Group V precursor may be at least one of nitrogen (N), phosphorus (P), and arsenic (As).

The Group V precursor may be at least one precursor compound selected from alkyl phosphine, tris(trialkylsilyl) phosphine, tris(dialkylsilyl) phosphine, tris(dialkylamino) phosphine, arsenic oxide, arsenic chloride, arsenic sulfate, arsenic bromide, arsenic iodide, nitric oxide, nitric acid, and ammonium nitrate.

The alkyl phosphine may be at least one of triethyl phosphine, tributyl phosphine, trioctyl phosphine, triphenyl phosphine, and tricyclohexyl phosphine.

A Group VI element of the Group VI precursor may be at least one of sulfur (S), selenium (Se) and tellurium (Te).

The Group VI precursor may be at least one precursor compound selected from sulfur, trialkylphosphine sulfide, trialkenylphosphine sulfide, alkylamino sulfide, alkenylamino sulfide, alkylthiol, selenium, trialkylphosphine selenide, trialkenylphosphine selenide, alkylamino selenide, alkenylamino selenide, trialkylphosphine telluride, trialkenylphosphine telluride, alkylamino telluride, and alkenylamino telluride.

The alkylthiol may be at least one of hexane thiol, octane thiol, decane thiol, dodecane thiol, hexadecane thiol, and mercaptopropyl silane.

An organic ligand compound respectively mixed with the Group II precursor and the Group III precursor may coordinate the surface of a nanocrystal formed in the method and thus may have an influence on light emission and electrical characteristics. The organic ligand may also facilitate the dispersion of the nanocrystal in a solution.

The organic ligand compound may include RCOOH, $RNH_2$, $R_2NH$, $R_3N$, RSH, $R_3PO$, $R_3P$, ROH, RCOOR', or a combination thereof. Herein, R and R' are independently a C1 to C24 alkyl group or a C5 to C24 aryl group.

The organic ligand compound may be at least one of methane thiol, ethane thiol, propane thiol, butane thiol, pentane thiol, hexane thiol, octane thiol, dodecane thiol, hexadecane thiol, octadecane thiol, benzyl thiol, methane amine, ethane amine, propane amine, butane amine, pentane amine, hexane amine, octane amine, dodecane amine, hexadecyl amine, octadecyl amine, dimethyl amine, diethyl amine, dipropyl amine, methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, methyl phosphine, ethyl phosphine, propyl phosphine, butyl phosphine, pentyl phosphine and the like phosphine, methyl phosphine oxide, ethyl phosphine oxide, propyl phosphine oxide, butyl phosphine oxide and the like phosphine compound or an oxide compound thereof, diphenyl phosphine, tri phenyl phosphine compound or an oxide compound thereof, phosphonic acid, and a combination thereof, as examples.

The organic solvent in which the Group V precursor and Group VI precursor are mixed may be a hydrophobic solvent.

Such an organic solvent may be at least one of a C6 to C22 primary alkylamine such as hexadecylamine, a C6 to C22 secondary alkylamine such as dioctylamine, a C6 to C40 tertiary alkylamine such as trioctylamine, a nitrogen-containing heterocyclic compound such as pyridine, a C6 to C40 aliphatic hydrocarbon (alkane, alkene, alkyne, etc.) such as hexadecane, octadecane, octadecene, and squalane, a C6 to C30 aromatic hydrocarbon such as phenyldodecane, phenyltetradecane, and phenyl hexadecane, a C6 to C22 alkyl group-substituted phosphine such as trioctylphosphine, a C6 to C22 alkyl group-substituted phosphine oxide such as trioctylphosphine oxide, a C12 to C22 aromatic ether such as phenyl ether and benzyl ether, and a combination thereof, as examples.

In the method, a first mixture obtained by mixing the Group II and Group III precursor solutions may be heat-treated and cooled to room temperature (S120).

The first mixture may include the Group II precursor and the Group III precursor in a mole ratio of about 3:2.

The heat treatment of the first mixture of the Group II and Group III precursor solutions may be performed at about 100 to about 140° C. for about 30 to about 90 minutes under a vacuum condition.

An organic solvent may be injected into the heat-treated first mixture, and the obtained mixture may be cooled to room temperature (about 15 to about 25° C.) under an inert gas atmosphere. The inert gas may include nitrogen having lower relative reactivity than other gases as well as a gas in Group 0 (noble gas) having small reactivity.

This heat treatment and cooling under a nitrogen or inert gas atmosphere may remove moisture and oxygen from the first mixture.

A second mixture obtained by injecting a Group V precursor solution to the first mixture may be heat-treated (S130).

The Group V precursor may be injected in a mole ratio of about 1:1 relative to the sum of the Group II precursor and the Group III precursor.

The heat-treatment of the second mixture may be performed by gradually increasing the temperature from room temperature to about 250° C. to about 350° C. at a rate of about 15 to about 25° C./min.

TA mixture of the Group V and Group VI precursor solutions may be injected into the second mixture, preparing a third mixture (S140).

The Group VI precursor may be injected at a mole ratio of about 1 to 2:1 relative to the sum of the Group II precursor and the Group III precursor.

The third mixture may be prepared by injecting the mixture of the Group V and Group VI precursor solutions into the second mixture while the second mixture is maintained at about 250 to about 350° C. The third mixture may be prepared by mixing the Group V precursor solution and the Group VI precursor solution and then injecting the mixture of the Group V precursor solution and the Group VI precursor solution into the second mixture.

The mixture of the Group V and Group VI precursor solutions may include at least one of hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, selenium-trioctylphosphine (Se-TOP), selenium-tributylphosphine (Se-TBP), selenium-triphenylphosphine (Se-TPP), tellurium-tributylphosphine (Te-TBP), tellurium-triphenylphosphine (Te-TPP), tris(trimethylsilyl)phosphine, tris(dimethylamino) phosphine, triethylphosphine, tributylphosphine, trioctylphosphine, triphenylphosphine, tricyclohexylphosphine, arsenic oxide, arsenic chloride, arsenic sulfate, arsenic bromide, arsenic iodide, nitric oxide, nitric acid, and ammonium nitrate, as examples.

The third mixture may be prepared by continuously adding the mixture of the Group V and Group VI precursor solutions in a predetermined amount to the second mixture in a dropwise fashion. The addition in a dropwise fashion to prepare the third mixture may prevent or reduce a temperature decrease and a reaction speed change due to the injection of the mixture of the Group V and Group VI precursor solutions.

The third mixture may be reacted to form the core and the shell of quantum dots (S150).

The third mixture may be allowed to react for about 5 to about 15 minutes after completion of the addition of the mixture of the Group V and Group VI precursor solutions. The core and the shell of the quantum dots may be simultaneously formed in the third mixture while the third mixture is reacted.

As for the core of the quantum dots, two kinds of cores may be respectively formed as a bond of a Group III element of the Group III precursor and a Group V element of the Group V precursor, and as a bond of a Group II element of the Group II precursor and a Group VI element of the Group VI precursor.

As a core, a Group III-V compound may include a binary element compound selected from GaN, GaP, GaAs, GaSb, AlN, AlP, AlAs, AlSb, InN, InP, InAs, InSb, and a mixture thereof, a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof, and a quaternary element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, as examples.

As another core, a Group II-VI compound may include a binary element compound selected from CdSe, CdTe, ZnS, ZnSe, ZnTe, ZnO, HgS, HgSe, HgTe, MgSe, MgS, and a mixture thereof, a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary element compound selected from HgZnTeS, CdZnSeS, CdZnSeTe, CdZnSTe, CdHgSeS, CdHgSeTe, CdHgSTe, HgZnSeS, HgZnSeTe, and a mixture thereof, as examples.

The shell of the quantum dots may be formed through a bond of a Group II element of the Group II precursor and/or a Group III element of the Group III precursor with a Group VI element of the Group VI precursor.

The shell may include at least one material selected from CdSe, ZnSe, ZnS, ZnTe, CdTe, PbS, TiO, SrSe, CdO, CdS, ZnO, InP, InS, GaP, GaN, GaO, InZnP, InGaP, InGaN, InZnSCdSe, and HgSe, as examples.

When the reaction is complete, the third mixture may be cooled to room temperature and then purified and re-dispersed, obtaining quantum dots (S160).

The purification and re-dispersion processes may further include separation of the quantum dots by adding a non-solvent to the third mixture. The non-solvent may be a polar solvent capable of being mixed with the organic solvent used in the reaction but not dispersing the quantum dots.

Such a non-solvent may be selected depending on the organic solvent used in the reaction. For example, the non-solvent may be any one selected from acetone, ethanol, butanol, isopropanol, ethanediol, water, tetrahydrofuran (THF), dimethylsulfoxide (DMSO), diethylether, formaldehyde, acetaldehyde, ethylene glycol, and a solvent having a similar solubility parameter to the foregoing solvents.

In addition, the separation of the quantum dots may be performed through centrifugation, precipitation, chromatography, or distillation. The separated quantum dots may be added to a cleaning solvent and cleaned if desired. The cleaning solvent may include hexane, heptane, octane, chloroform, toluene, benzene, or the like, as examples.

Hereinafter, the present disclosure is illustrated in more detail with reference to examples. However, these examples are exemplary, and the present disclosure is not limited thereto.

EXAMPLE 0.4 mmol of indium acetate, 0.4 mmol of cadmium oxide, 0.2 mmol of zinc acetate, and 2 ml of oleic acid were put in a reactor and heated at 120° C. for 1 hour under a vacuum condition. After the heating, 18 ml of 1-octadecene was added to the reactor, and the mixture was cooled down to room temperature after substituting the atmosphere inside the reactor with nitrogen.

Subsequently, another mixture obtained by mixing 0.4 mmol of tris(trimethylsilyl)phosphine, 0.6 mmol of trioctyl phosphine, and 4.5 ml of 1-octadecene was injected into the reactor. The reactor was gradually heated up to 300° C. at a speed of 20° C./min.

Then, 0.2 mmol of selenium, 2 mmol of sulfur, and 2 ml of trioctylphosphine were mixed to prepare a mixture of selenium-trioctylphosphine (Se-TOP) and sulfur-trioctylphosphine (S-TOP). This mixture was injected drop by drop by a dripping method into the reactor. The resulting mixture was reacted for 10 minutes.

The reactor was cooled to room temperature, and a quantum dot mixture was obtained by performing precipitation with acetone and centrifugation with a composite solvent including hexane and ethanol. It was determined that the quantum dot mixture included one type of quantum dot having a core of InP and a shell of ZnS, and another type of quantum dot having a core of CdSe and a shell of ZnS.

The quantum dot mixture was measured with respect to a light emitting wavelength. The result is provided in FIG. 2.

Figure 2:
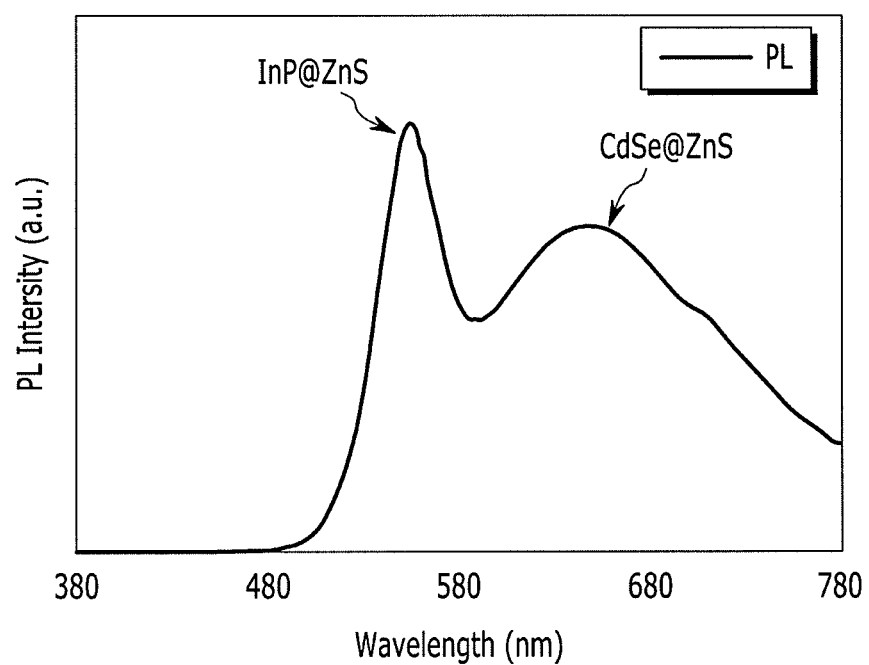
FIG. 2 illustrates a graph showing the light emitting wavelength of a quantum dot manufactured according to the method for manufacturing a quantum dot according to an embodiment.

In a graph shown in FIG. 2, a vertical axis indicates luminance intensity and a horizontal axis indicates a light emitting wavelength.

Referring to FIG. 2, the obtained quantum dot mixture was found to have a light emission of a green wavelength ranging from 500 to 600 nm and a red wavelength ranging from 600 to 700 nm, the green wavelength being emitted by the quantum dot having a core of InP and a shell of ZnS, and the red wavelength being emitted by the quantum dot having a core of CdSe and a shell of ZnS.

Accordingly, two kinds of quantum dots, emitting green and red, respectively, may be manufactured through a single process.

Hereinafter, application of the quantum dot according to one embodiment is illustrated referring to FIGS. 3 and 4.

Figure 3:
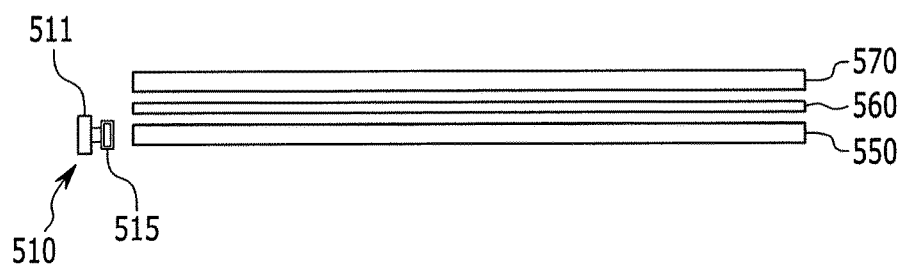
FIG. 3 illustrates a view showing a backlight unit manufactured by using the quantum dot according to an embodiment.

FIG. 3 illustrates a display device manufactured by using the quantum dot according to an embodiment.

Referring to FIG. 3, the display device according to this embodiment may include a light source module 510, a light guide 550, an optical film 560, and a display panel 570. The optical film 560 may improve directivity of light shed toward the display panel 570 or the like. The optical film 560 may be disposed on the light-exiting surface of the light guide 550. This optical film 560 may include, for example, a prism sheet and a diffuser sheet. The display panel 570 may convert an electrical video signal into an image. The display panel 571 may be, for example, a liquid crystal panel or the like. Light emitted from the light source module 510 may enter the side of the light guide 550, exit through the light-exiting side of the light guide 550, pass the optical film 560, and illuminate the rear side of the display panel 570.

The light source module 510 may include a light emitting element package 511 and a quantum dot rail 515 disposed in a light emitting direction of the light emitting element package 511. With respect for the quantum dot rail 515, a quantum dot mixture manufactured in a method according to embodiments may be sealed inside the package.

The present exemplary embodiment may provide a display device including the quantum dot rail 515. In some implementations, the display device may include a quantum dot film disposed on the light guide 550 and on the optical film 560.

Figure 4:
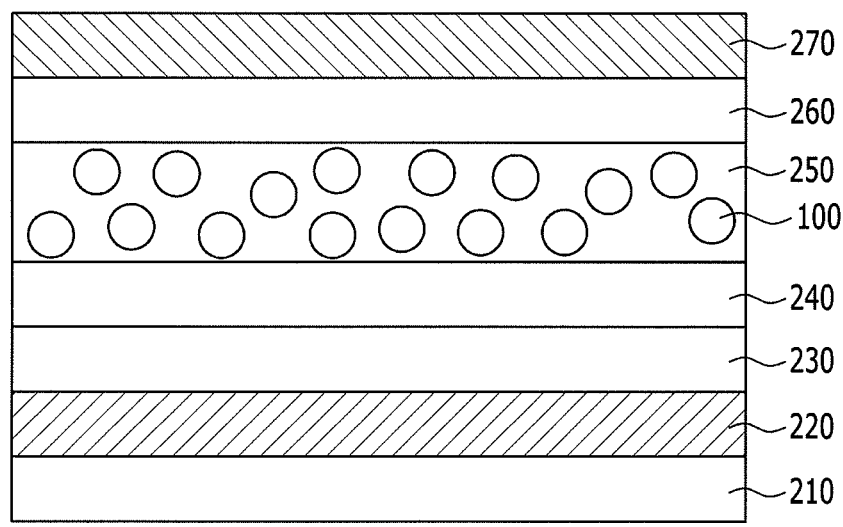
FIG. 4 illustrates a view showing an organic light emitting diode (OLED) display manufactured by using the quantum dot according to an embodiment.

FIG. 4 illustrates an organic light emitting diode (OLED) display manufactured by applying the quantum dot according to an embodiment.

Referring to FIG. 4, an organic light emitting diode (OLED) display 200 according to this embodiment may include an anode 220, a hole injection layer (HIL) 230, a hole transport layer (HTL) 240, an emission layer 250, an electron transport layer (ETL) 260, and a cathode 270, which may be sequentially stacked on a substrate 210.

The anode 220 may include a metal or a metal oxide, for example, indium tin oxide (ITO), zinc oxide, indium oxide, tin oxide, indium zinc oxide, or the like.

The hole injection layer (HIL) 230 may include, for example, PEDOT (poly(3,4-ethylenedioxythiophene)), PSS (polystyrene sulfonate), or the like.

The hole transport layer (HTL) 240 may include, for example, polyvinylcarbazole (PVK), NPD (N,N-diphenyl-N,N-bis(1-naphthylphenyl)-1,1'-biphenyl-4,4'-diamine), poly-TPD (poly(N,N-bis(4-butylphenyl)-N—N'-bis(phenyl-benzidine)), poly-TFB (poly[(9,9-dioctylfluorenyl-2,7-diyl)-co-(4,4'-(N-(4-sec-butylphenyl))diphenyl-amine)], PPV (poly(1,4-phenylenevinylene), or the like.

The emission layer 250 may include a mixture of the quantum dots 100 manufactured according to the method of an embodiment that is dispersed in a solvent of water, hexane, chloroform, toluene, or the like.

The electron transport layer (ETL) 260 may include BCP (2,9-dimethyl-4,7-diphenyl-1,10-phenanhro-line), TPBI (1,3,5-tris(N-phenylbenzimidazol-2,yl)benzene), or the like.

The cathode 270 may include a metal such as calcium (Ca), aluminum (Al), magnesium (Mg), silver (Ag), barium (Ba), or the like, a metal alloy, or a metal oxide.

The emission layer 250 including the quantum dot mixture 100 according to the present exemplary embodiment may have high light emitting characteristics. The organic light emitting diode (OLED) display 200 including the emission layer 250 may have high luminance, low current density, and high current efficiency.

By way of summation and review, a quantum dot absorbs light from an excitation source and enters an energy exited state, and then emits energy corresponding to its own energy bandgap. A quantum dot has an energy bandgap that may be adjusted by controlling the size and composition of a nanocrystal. A quantum dot has high color purity and light emitting characteristics and thus, may be variously developed and applied to a display device, an energy device, a bio-light emitting element, or the like.

Quantum dots may be synthesized in a vapor deposition method such as a metal organic chemical vapor deposition (MOCVD), molecular beam epitaxy (MBE), or the like, a chemical wet method of growing a crystal by adding a precursor material to an organic solvent, or the like. With these methods, quantum dots having different light emitting wavelengths from each other have to be respectively synthesized through different processes. Accordingly, a quantum dot synthesis process to provide quantum dots emitting different wavelengths becomes complicated Embodiments provide a method for manufacturing quantum dots having different wavelengths through one process and provide a method that simplifies the process of manufacturing a quantum dot.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of manufacturing a mixture of quantum dots having at least two kinds of cores, the method comprising:

heating a first mixture including a Group II precursor and a Group III precursor;

adding an organic solvent to the first mixture to provide a resultant and cooling the resultant under an inert gas atmosphere;

adding a Group V precursor solution to the cooled resultant including the first mixture and the organic solvent to prepare a second mixture and heating the second mixture; and adding a mixture of a Group V precursor and a Group VI precursor to the second mixture to prepare a third mixture and allowing third mixture to react.

2. The method as claimed in claim 1, wherein:

heating the first mixture is performed in a reactor at about 100° C. to about 140° C. for about 30 to 90 minutes, and cooling the resultant obtained by adding the organic solvent to the first mixture cools the resultant to room temperature.

3. The method as claimed in claim 2, wherein heating the second mixture is performed by gradually increasing the temperature from room temperature to about 250 to about 350° C. at a rate of about 15 to 25° C./min.

4. The method as claimed in claim 3, wherein the third mixture is prepared by dripping the mixture of the Group V precursor solution and the Group VI precursor solution into the second mixture.

5. The method as claimed in claim 4, wherein the third mixture is allowed to react for about 5 to 15 minutes after the mixture of the Group V precursor solution and the Group VI precursor solution is dripped into the second mixture.

6. The method as claimed in claim 1, wherein the first mixture includes the Group II precursor and the Group III precursor in a mole ratio of about 3:2.

7. The method as claimed in claim 6, wherein the second mixture includes the Group V precursor and the Group II and Group III precursor such that a ratio of moles of the Group V precursor to a sum of moles of the Group II and Group III precursors is about 1:1.

8. The method as claimed in claim 7, wherein the third mixture includes the Group VI precursor and the Group II and Group III precursor such that a ratio of moles of the Group VI precursor to a sum of moles of the Group II and Group III precursors about is in a range of 1:1 to 2:1.

9. The method as claimed in claim 1, wherein a Group II element of the Group II precursor is at least one of zinc (Zn), cadmium (Cd), and mercury (Hg).

10. The method as claimed in claim 9, wherein the Group II precursor is at least one precursor compound selected from zinc acetate, dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, cadmium oxide, dimethyl cadmium, diethyl cadmium, cadmium carbonate, cadmium acetate dihydrate, cadmium acetylacetonate, cadmium fluoride, cadmium chloride, cadmium iodide, cadmium bromide, cadmium perchlorate, cadmium phosphide, cadmium nitrate, cadmium sulfate, cadmium carboxylate, mercury iodide, mercury bromide, mercury fluoride, mercury cyanide, mercury nitrate, mercury perchlorate, mercury sulfate, mercury oxide, mercury carbonate, and mercury carboxylate.

11. The method as claimed in claim 9, wherein a Group III element of the Group III precursor is at least one element of aluminum (Al), gallium (Ga), and indium (In).

12. The method as claimed in claim 11, wherein the Group III precursor is at least one precursor compound selected from aluminum phosphate, aluminum acetylacetonate, aluminum chloride, aluminum fluoride, aluminum oxide, aluminum nitrate, aluminum sulfate, gallium acetylacetonate, gallium chloride, gallium fluoride, gallium oxide, gallium nitrate, gallium sulfate, indium acetate, indium chloride, indium oxide, indium nitrate, indium sulfate, and indium carboxylate.

13. The method as claimed in claim 11, wherein a Group V element of the Group V precursor is at least one element of nitrogen (N), phosphorus (P), and arsenic (As).

14. The method as claimed in claim 13, wherein the Group V precursor is at least one precursor compound selected from alkyl phosphine, tris(trialkylsilyl) phosphine, tris(dialkylsilyl) phosphine, tris(dialkylamino) phosphine, arsenic oxide, arsenic chloride, arsenic sulfate, arsenic bromide, arsenic iodide, nitric oxide, nitric acid, and ammonium nitrate.

15. The method as claimed in claim 13, wherein a Group VI element of the Group VI precursor is at least one element of sulfur (S), selenium (Se), and tellurium (Te).

16. The method as claimed in claim 15, wherein the Group VI precursor is at least one precursor compound selected from sulfur, trialkylphosphine sulfide, trialkenylphosphine sulfide, alkylamino sulfide, alkenylamino sulfide, alkylthiol, selenium, trialkylphosphine selenide, trialkenylphosphine selenide, alkylamino selenide, alkenylamino selenide, trialkylphosphine telluride, trialkenylphosphine telluride, alkylamino telluride, and alkenylamino telluride.

17. The method as claimed in claim 15, wherein the mixture of the Group V and Group VI precursor solutions includes at least one of hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, selenium-trioctylphosphine (Se-TOP), selenium-tributylphosphine (Se-TBP), selenium-triphenylphosphine (Se-TPP), tellurium-tributylphosphine (Te-TBP), tellurium-triphenylphosphine (Te-TPP), tris trimethylsilyl phosphine, trisdimethylamino phosphine, triethylphosphine, tributylphosphine, trioctylphosphine, triphenylphosphine, tricyclohexylphosphine, arsenic oxide, arsenic chloride, arsenic sulfate, arsenic bromide, arsenic iodide, nitric oxide, nitric acid, and ammonium nitrate.

18. The method as claimed in claim 1, wherein:
the Group II precursor includes a zinc-containing precursor and a cadmium-containing precursor;
the Group III precursor includes an indium-containing precursor;
the Group V precursor is a phosphine;
the Group VI precursor includes a selenium-containing precursor and sulfur-containing precursor; and
the mixture of the Group V and Group VI precursor includes a sulfur phosphine compound and a selenium phosphine compound.

19. The method as claimed in claim 15, wherein:
the Group II precursor includes cadmium oxide and zinc acetate,
the Group III precursor includes indium acetate,
the Group V precursor includes tris(trimethylsilyl)phosphine and trioctylphosphine,
the Group VI precursor includes selenium and sulfur, and
the mixture of the Group V and Group VI precursor includes sulfur-trioctylphosphine and selenium-trioctylphosphine.

20. A method of forming a mixture of CdSe/ZnS quantum dots and InP/ZnS quantum dots, the method comprising:
heating a first mixture including cadmium oxide, zinc acetate, and indium acetate, and cooling the first mixture;
adding tris(trimethylsilyl)phosphine and trioctylphosphine to the cooled resultant including the first mixture and the organic solvent to prepare a second mixture and heating the second mixture while increasing the temperature; and
adding sulfur-trioctylphosphine and selenium-trioctylphosphine to the second mixture to prepare a third mixture and allowing third mixture to react.

* * * * *